United States Patent
Herzum et al.

(10) Patent No.: US 6,852,585 B2
(45) Date of Patent: Feb. 8, 2005

(54) SEMICONDUCTOR CIRCUIT ARRANGEMENT AND A METHOD FOR PRODUCING SAME

(75) Inventors: Christian Herzum, Poecking (DE); Ulrich Krumbein, Rosenheim (DE); Karl-Heinz Mueller, Velden (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/148,379

(22) PCT Filed: Nov. 30, 2000

(86) PCT No.: PCT/EP00/12051
§ 371 (c)(1),
(2), (4) Date: Aug. 21, 2002

(87) PCT Pub. No.: WO01/41187
PCT Pub. Date: Jun. 7, 2001

(65) Prior Publication Data
US 2003/0122212 A1 Jul. 3, 2003

(30) Foreign Application Priority Data
Nov. 30, 1999 (DE) .......................................... 199 57 532

(51) Int. Cl.[7] .......................................... H01L 21/8238
(52) U.S. Cl. ........................ 438/207; 257/370; 257/371; 257/503; 257/507
(58) Field of Search .................. 438/207; 257/503–507, 257/370, 371, 336

(56) References Cited

U.S. PATENT DOCUMENTS

| | | | | |
|---|---|---|---|---|
| 5,319,236 A | * | 6/1994 | Fujihira ....................... 257/493 |
| 5,378,913 A | | 1/1995 | Hoeltge | |
| 5,751,033 A | | 5/1998 | Miya | |
| 5,773,860 A | * | 6/1998 | Kijima et al. ................ 257/306 |
| 5,874,768 A | | 2/1999 | Yamaguchi et al. | |
| 6,034,388 A | * | 3/2000 | Brown et al. ................ 257/296 |
| 6,320,234 B1 | * | 11/2001 | Karasawa et al. ........... 257/371 |
| 6,646,311 B2 | * | 11/2003 | Chatterjee .................... 257/370 |

OTHER PUBLICATIONS

Japanese Abstract, 58070572, Publication Date Apr. 27, 1983.
Japanese Abstract, 01074760, Publication Date Mar. 20, 1989.
Japanese Abstract, 01293565, Publication Date Nov. 27, 1989.
Japanese Abstract, 08181218 A, Publication Date Jul. 12, 1996.
Yoshida, "Highly Efficient UHF–Band Si Power MOSFET for RF Powers Amplifiers", Electronics and Communications in Japan, Part 2. vol. 77. No. 4. 1994. pp. 10–19.
Yoshida, "2–GHz Si Power Mosfet Technology", pp. 3.1.1–3.1.4.

* cited by examiner

*Primary Examiner*—Long Pham
*Assistant Examiner*—Nathan W. Ha
(74) *Attorney, Agent, or Firm*—Schiff Hardin LLP

(57) ABSTRACT

A semiconductor circuit arrangement includes a circuit element embedded in a semiconductor substrate of a first conductivity type in an integrated manner and is provided with at least one gate electrode and first and second terminal electrodes. The first terminal electrode includes a well region that is embedded in the semiconductor substrate and is of a second conductivity type which is opposite the first conductivity type. A sub-well region is embedded in the well region of the first terminal electrode and is of the second conductivity type and has a higher doping than said well region. The sub-well region is embedded in the surface of the substrate and ends without reaching a well region of the gate electrode which is of the first conductivity type.

9 Claims, 1 Drawing Sheet

SEMICONDUCTOR CIRCUIT ARRANGEMENT AND A METHOD FOR PRODUCING SAME

BACKGROUND OF THE INVENTION

1. Field of the Invention

The present invention relates to a semiconductor circuit arrangement having a circuit element which is formed in an integrated manner in a semiconductor substrate of a first conductivity type and has at least one control terminal and a first and second electrode terminal, the first electrode terminal being formed by a terminal well—embedded within the semiconductor substrate—of a second conductivity type opposite to the first conductivity type and a sub-well region of the second conductivity type which is situated within the terminal well but is doped more highly than the terminal well, and also to a method for producing such a semiconductor circuit arrangement 2. Description of the Related Art Known examples of such semiconductor circuit arrangements are MOS tetrodes and MOS pentodes having a plurality of control terminals, in particular having at least two gate terminals, namely a high-frequency gate and at least one control gate, which are fabricated either as individual components or in highly integrated form on a semiconductor substrate by means of VLSI technology steps (VLSI=very large scale integration). A suitability for supply voltages of 12 V or more is demanded in particular when such MOS tetrodes are used in automotive engineering. The modern CMOS process fabrication methods are generally only designed for the fabrication of semiconductor circuits for supply voltages of <5 V and are not readily suitable for the fabrication of semiconductor circuits with higher supply voltage ranges. Essential technological reasons for this reside, inter alia, in the excessively small gate oxide thickness and also in an excessively low drain-well breakdown voltage in the semiconductor circuits which are fabricated in modern standard CMOS processes and are therefore not readily suitable for the fabrication of MOS tetrodes and MOS pentodes with supply voltages of 12 V or more.

SUMMARY OF THE INVENTION

The present invention is based on the object of providing a semiconductor circuit arrangement, in particular one with a plurality of control terminals, namely at least two gate terminals, one of which is a high-frequency gate, as in the case of tetrodes or pentodes, which has a first electrode terminal which enables supply voltages of 12 V or more, and of specifying a method for producing such a semiconductor circuit arrangement which can be carried out in a simple manner.

The object is achieved by the method for producing a semiconductor circuit arrangement having a circuit element which is formed in an integrated manner in a semiconductor substrate of a first conductivity type and has at least one control terminal and a first and second electrode terminal, the first electrode terminal being formed by a terminal well—embedded within the semiconductor substrate—of a second conductivity type opposite to the first conductivity type and a sub-well region of the second conductivity type which is situated within the terminal well but is doped more highly than the terminal well, the sub-well region of the second conductivity type which is formed in the main surface of the semiconductor substrate and is assigned to the first electrode terminal ends before the well region of the first conductivity type of the at least one control terminal. The object is also achieved by a semiconductor circuit arrangement having a circuit element which is formed in an integrated manner in a semiconductor substrate of a first conductivity type and has at least one control terminal and a first and second electrode terminal, the first electrode terminal being formed by a terminal well—embedded within the semiconductor substrate—of a second conductivity type opposite to the first conductivity type and a sub-well region of the second conductivity type which is situated within the terminal well but is doped more highly than the terminal well, the sub-well region of the second conductivity type which is formed in the main surface of the semiconductor substrate and is assigned to the first electrode terminal ends before the well region of the first conductivity type of the at least one control terminal.

According to the invention, it is provided that the sub-well region of the second conductivity type which is formed in the main surface of the semiconductor substrate and is assigned to the first electrode terminal ends before the well region of the first conductivity type of the at least one control terminal.

BRIEF DESCRIPTION OF THE DRAWINGS

Further features, advantages and expediencies of the invention emerge from the following description of exemplary embodiments of the invention with reference to the drawings.

DETAILED DESCRIPTION OF THE PREFERRED EMBODIMENTS

The preferred embodiments described hereinbelow do not limit the scope of the claims.

Figure 1:
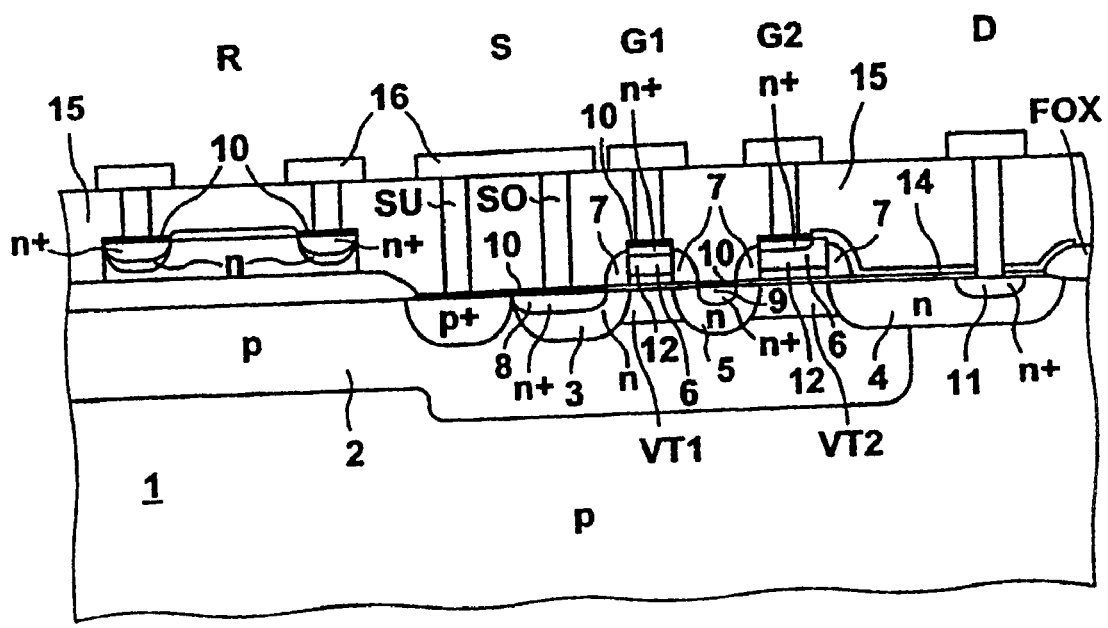
FIG. 1 shows a diagrammatic sectional view of a preferred exemplary embodiment of the invention.

The semiconductor circuit arrangement shown in FIG. 1 comprises a high-frequency MOS tetrode as a circuit element of an integrated semiconductor circuit according to the particularly preferred exemplary embodiment of the invention. It is produced according to a standard CMOS process method, which is assumed to be known, with a semiconductor substrate 1 made of p-conducting silicon (p-doping =first conductivity type according to this definition), the circuit element which is formed in an integrated manner having at least two control terminals made of polysilicon 6 on gate dielectrics 12, namely a high-frequency gate G1 with a channel region VT1 and a control gate G2—isolated by the intermediate region—with a channel region VT2, and also a first electrode terminal, namely a drain terminal D, and a second electrode terminal, namely a source terminal S (comprising a source So and a substrate terminal Su). The channel regions VT1 and VT2 arranged below the polygates G1 and G2 may be doped differently by different channel implantations, that is to say also be, for instance, in each case n- or p-doped. A p-type region 2 formed in the substrate 1 by doping serves as a p-type well and the p+-type region embedded therein serves as a substrate terminal. The reference numerals 3, 4 and 5 designate lightly doped n-LDD regions (LDD=lightly doped drain) in each case in source, drain and intermediate regions. Spacers 7 made of a suitable dielectric are formed laterally beside the gates G1 and G2; the reference numerals 8, 9 and 11 designate n+-doped contact regions in the source terminal S, drain terminal D, and also in the intermediate region between the two gates, the contact regions 8, 9 and 11 as can be seen in the illustration in each case from source S and intermediate region being isolated by the spacer 7 from the relevant gate or channel. A larger distance between the gate G2 or channel and the drain terminal D is set to a suitable setting by means of a mask. The gate terminals G1 and G2 are partly or else completely implanted with n+-type doping. The p-type well 2 ends in the region between the gate G2 and the n+-doped contact region 11 of the drain terminal D. R designates a high-resistance resistor.

Figure 2:
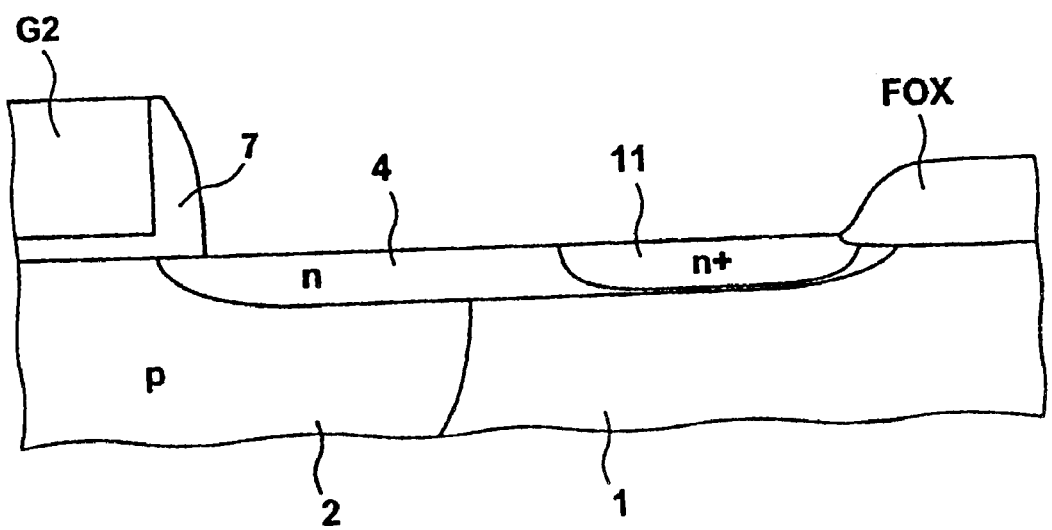
FIG. 2 shows an enlarged partial view of the exemplary embodiment of the invention.

FIG. 2 shows, in an enlarged partial view, further details on the drain construction according to the invention, with which it was possible to obtain an increase in the drain-well breakdown voltage. The increased terminal resistance due to this construction in comparison with the customary standard CMOS drain construction has no disadvantages whatsoever in most applications, since the output of the tetrodes e.g. in tuners is connected at high resistance. In addition to the increased dielectric strength, this drain construction also yields a low output capacitance $C_{oss}$ and thus performance gains. For this reason, this drain construction can also preferably be used in those tetrodes in which the dielectric strength of a standard drain construction is sufficient but which are used in high-frequency applications. The drain construction according to the invention as illustrated in more detail in FIG. 2 is distinguished by the fact that the p-conducting well region 2 of the second gate terminal G2 stops before the $n^+$-doped contact region 11 of the drain terminal D, which is embedded in the terminal region (n-doped LDD) 4 of the second conductivity type n, which terminal region is formed in the main surface of the semiconductor substrate 1.

The method thus is further characterized in that the semiconductor circuit arrangement is formed as a discrete component with at least two control terminals. The method of one example provides that the semiconductor circuit arrangement constitutes a high-frequency transistor with at least two control terminals.

In the semiconductor circuit arrangement of a preferred embodiment, the semiconductor circuit arrangement is formed as a discrete component with at least two control terminals. In one embodiment, the semiconductor circuit arrangement constitutes a high-frequency transistor with at least two control terminals.

Although other modifications and changes may be suggested by those skilled in the art, it is the intention of the inventors to embody within the patent warranted hereon all changes and modifications as reasonably and properly come within the scope of their contribution to the art.

What is claimed is:

1. A method for producing a semiconductor circuit arrangement having a circuit element which is formed in an integrated manner in a semiconductor substrate of a first conductivity type and has at least one control terminal and a first electrode terminal and a second electrode terminal, comprising the steps of:

forming a well region of the first conductivity type of the at least one control terminal;

forming the first electrode terminal by a terminal well and a sub-well region
      the terminal well being embedded within the semiconductor substrate, said terminal well being of a second conductivity type opposite to the first conductivity type,
      the sub-well region being of the second conductivity type and being doped more highly than the terminal well, the sub-well region being situated within the terminal well, the sub-well region being formed in a main surface of the semiconductor substrate; and ending the sub-well region which is assigned to the first electrode terminal before the well region of the first conductivity type of the at least one control terminal.

2. A method as claimed in claim 1, wherein said at least one control terminal is at least two control terminals, and further comprising the steps of:

forming the semiconductor circuit arrangement as a discrete component with the at least two control terminals.

3. A method as claimed in claim 1, wherein said at least one control terminal is at least two control terminals, and wherein the semiconductor circuit arrangement is a high-frequency transistor with the at least two control terminals.

4. A semiconductor circuit arrangement, comprising:

a circuit element formed in an integrated manner in a semiconductor substrate of a first conductivity type;

at least one control terminal for said circuit element, said at least one control terminal including a well region of the first conductivity type;

first and second electrode terminals of said circuit element,
      said first electrode terminal including a terminal well embedded within the semiconductor substrate, said terminal well being of a second conductivity type opposite to the first conductivity type,
      said first electrode terminal also including a sub-well region of the second conductivity type which is situated within the terminal well but is doped more highly than the terminal well, said sub-well region being formed in a main surface of the semiconductor substrate and being assigned to the first electrode terminal, said sub-well ending before said well region of the first conductivity type of said at least one control terminal.

5. A semiconductor circuit arrangement as claimed in claim 4, wherein said at least one control terminal includes at least two control terminals, and wherein said semiconductor circuit arrangement is a discrete component with said at least two control terminals.

6. A semiconductor circuit arrangement as claimed in claim 4, wherein said at least one control terminal includes at least two control terminals, and wherein said semiconductor circuit arrangement is a high-frequency transistor with said at least two control terminals.

7. A MOS field effect transistor, comprising:

a substrate having a major surface, said substrate being of a first conductivity type;

source and drain terminals connected to said substrate;

at least one gate terminal connected to said substrate;

a first well in said substrate at said major surface, said at least one gate terminal and one of said source terminal and said drain terminal being connected to said first well, said first well being of said first conductivity type;

a second well in said substrate at said major surface, said second well being of a second conductivity type that is opposite to said first conductivity type;

a sub-well in said second well, said sub-well being at said major surface of said substrate, said sub-well being connected to a one of said source terminal and said drain terminal that is not connected to said first well, said sub-well being of said second conductivity type and being of a higher doping level than said second well, said sub-well and said first well being spaced apart in a direction parallel to said major surface.

8. A MOS field effect transistor as claimed in claim 7, wherein said other of said source and drain terminals connected to said sub-well is said drain terminal.

9. A MOS field effect transistor as claimed in claim 7, wherein said at least one gate terminal includes two gate terminals.

* * * * *